United States Patent
Han et al.

(10) Patent No.: US 9,653,664 B2
(45) Date of Patent: May 16, 2017

(54) CHIP SUBSTRATE COMPRISING A GROOVE PORTION AND CHIP PACKAGE USING THE CHIP SUBSTRATE

(71) Applicant: Point Engineering Co., Ltd., Asan-si (KR)

(72) Inventors: Sin Seok Han, Hwaseong-si (KR); Soo Young Choi, Cheongju-si (KR); Ki Myung Nam, Cheonan-si (KR)

(73) Assignee: Point Engineering Co., Ltd., Asan-si, Chungcheongnam-do (KR)

( * ) Notice: Subject to any disclaimer, the term of this patent is extended or adjusted under 35 U.S.C. 154(b) by 0 days.

(21) Appl. No.: 14/753,915

(22) Filed: Jun. 29, 2015

(65) Prior Publication Data

US 2016/0380168 A1 Dec. 29, 2016

(51) Int. Cl.
*H01L 29/22* (2006.01)
*H01L 33/58* (2010.01)
(Continued)

(52) U.S. Cl.
CPC .............. *H01L 33/58* (2013.01); *H01L 33/486* (2013.01); *H01L 33/62* (2013.01); *H05K 1/0274* (2013.01);
(Continued)

(58) Field of Classification Search
CPC ........ H01L 33/58; H01L 33/62; H01L 33/486
(Continued)

(56) References Cited

U.S. PATENT DOCUMENTS 6,727,597 B2 * 4/2004 Taylor ............... H01L 23/49838
257/207
7,566,912 B2 * 7/2009 Lee ....................... H01L 33/486
257/95
(Continued)

FOREIGN PATENT DOCUMENTS

| KR | 10-0986211 B1 | 10/2010 | ............. H01L 33/62 |
|---|---|---|---|
| KR | 10-2012-0002351 | 1/2012 | ............. H01L 33/48 |
| KR | 10-2013-0101846 | 9/2013 | ............. H01L 33/48 |

OTHER PUBLICATIONS

Korean Intellectual Patent Office, Office Action—Korean Patent Application No. 10-2014-0064169, dated Sep. 23, 2015, 7 pages.
(Continued)

*Primary Examiner* — Hung Vu
(74) *Attorney, Agent, or Firm* — Sunstein Kann Murphy & Timbers LLP

(57) ABSTRACT

Disclosed is a chip substrate. The chip substrate includes: conductive portions laminated in one direction to constitute the chip substrate; insulation portions alternately laminated with the conductive portions to electrically isolate the conductive portions; a cavity formed at a predetermined depth in a recessed shape in a region including the insulation portions on an upper surface of the chip substrate; and a groove portion disposed outside the cavity in a spaced-apart relationship with the cavity and formed at a predetermined depth in a recessed shape. According to the present invention, an adhesive agent is applied in a groove portion formed in advance. It is therefore possible to prevent the adhesive agent from being exposed to the light emitted from optical elements and to prevent the adhesive agent from being denatured. This makes it possible to enhance the reliability of lens bonding. Furthermore, there is no need to use an expensive resistant adhesive agent. An existing typical adhesive agent may be used as it is. This provides an effect of
(Continued)

saving costs. Thus, there is an advantage in that a low-priced existing bonding material may be applied to a high-priced UV-C (deep-UV) package.

12 Claims, 2 Drawing Sheets

(51) Int. Cl.
    *H01L 33/48*     (2010.01)
    *H01L 33/62*     (2010.01)
    *H05K 1/03*     (2006.01)
    *H05K 1/02*     (2006.01)

(52) U.S. Cl.
    CPC ... *H05K 1/0313* (2013.01); *H05K 2201/2054* (2013.01)

(58) Field of Classification Search
    USPC .................................. 257/88, 98, 99, 100
    See application file for complete search history.

(56) References Cited

U.S. PATENT DOCUMENTS

| | | | |
|---|---|---|---|
| 8,044,418 B2 * | 10/2011 | Loh ...................... | H01L 33/483 257/666 |
| 8,058,664 B2 * | 11/2011 | Shi ........................ | H01L 33/483 257/98 |
| 8,896,078 B2 | 11/2014 | Kam et al. .................... | 257/432 |
| 2013/0234274 A1 * | 9/2013 | Kam ....................... | H01L 33/58 257/432 |

OTHER PUBLICATIONS

Korean Intellectual Patent Office, Office Action—Korean Patent Application No. 10-2014-0064169, dated Sep. 23, 2015, 8 pages (*English translation*).

* cited by examiner

CHIP SUBSTRATE COMPRISING A GROOVE PORTION AND CHIP PACKAGE USING THE CHIP SUBSTRATE

BACKGROUND

1. Technical Field

The present invention relates to a chip substrate and, more particularly, to a chip substrate including a groove portion and a chip package using the same.

2. Description of Related Art

In the related art, spaces for mounting chips to an uncut chip plate are formed on the upper surface of the uncut chip plate by mechanical processing or chemical etching. That is to say, Korean Patent No. 10-0986211 discloses a method in which mounting spaces are formed by etching an upper portion of an unprocessed rectangular uncut metal plate.

In the case where optical element chips such as UV LEDs or the like are mounted on such an uncut chip plate, spaces having a wide-top/narrow-bottom shape are formed in the uncut chip plate in order to enhance the light reflection performance. A chip package is manufactured by mounting chips in the spaces thus formed and sealing the spaces with molded lenses.

In this case, an adhesive agent (silicon, etc.) used in the sealing performed by a lens is exposed to the light, such as ultraviolet rays or the like, which is emitted from optical element chips. Since the adhesive agent has no resistance to the light, there is a problem in that the adhesive agent is denatured or hardened over time, thereby reducing the reliability of a chip package.

SUMMARY

In view of the above technical problem, it is an object of the present invention to provide a chip substrate structure capable of preventing an adhesive agent from being exposed to the light emitted from optical elements by forming a groove portion.

More specifically, it is an object of the present invention to provide a chip substrate and a lens structure, which are capable of preventing an adhesive agent from being exposed to the light emitted from optical elements by forming a groove portion to which the adhesive agent can be applied.

In accordance with one aspect of the present invention, there is provided a chip substrate, including: conductive portions laminated in one direction to constitute the chip substrate; insulation portions alternately laminated with the conductive portions to electrically isolate the conductive portions; a cavity formed at a predetermined depth in a recessed shape in a region including the insulation portions on an upper surface of the chip substrate; and a groove portion disposed outside the cavity in a spaced-apart relationship with the cavity and formed at a predetermined depth in a recessed shape.

The groove portion may be formed to continuously extend along an outer periphery of the cavity.

The chip substrate may further include: an outer wall formed between the cavity and the groove portion to isolate the groove portion from the cavity.

A height of the outer wall may be determined by a thickness of a sealing member for sealing the chip substrate.

The conductive portions or the insulation portions may be formed in a plural number and the cavity may be formed in a recessed shape in a region including at least two or more of the conductive portions and at least one or more of the insulation portions.

Each of the insulation portions may be bonded to each of the conductive portions through an anodizing layer formed on at least one surface of each of the conductive portions and may be configured to electrically isolate the conductive portions.

The chip substrate may further include: bumps formed at a predetermined height within the cavity on surfaces of the conductive portions isolated by the insulation portions, the bumps bonded to electrode portions formed in chips mounted on the chip substrate.

In accordance with another aspect of the present invention, there is provided a chip substrate sealing member, including: a sealing portion disposed on an upper surface of a chip substrate which includes conductive portions laminated in one direction and insulation portions alternately laminated with the conductive portions to electrically isolate the conductive portions, the sealing portion configured to seal a cavity formed at a predetermined depth in a recessed shape in a region including the insulation portions; and a shielding portion formed on one surface of the sealing portion in a corresponding relationship with a groove portion which is disposed outside the cavity in a spaced-apart relationship with the cavity and which is formed at a predetermined depth in a recessed shape.

A thickness of the shielding portion may be determined in view of a thickness of the groove portion and a spaced-apart distance between the cavity and the groove portion.

The shielding portion may be formed on one surface of the sealing portion at a thickness including the groove portion in order to prevent entry into the groove portion of light reflected by one surface of the sealing portion.

The shielding portion may be made of a material for shielding light reflected by one surface of the sealing portion in order to prevent entry into the groove portion of the light.

In accordance with a further aspect of the present invention, there is provided a chip package, including: a chip substrate which includes conductive portions laminated in one direction to constitute the chip substrate, insulation portions alternately laminated with the conductive portions to electrically isolate the conductive portions, a cavity formed at a predetermined depth in a recessed shape in a region including the insulation portions, and a groove portion disposed outside the cavity in a spaced-apart relationship with the cavity and formed at a predetermined depth in a recessed shape; an optical element mounted within the cavity; and a sealing member bonded to the chip substrate by an adhesive agent disposed within the groove portion in order to seal the cavity, the sealing member including a shielding portion formed on one surface corresponding to the groove portion.

According to the present invention, an adhesive agent is applied in a groove portion formed in advance. It is therefore possible to prevent the adhesive agent from being exposed to the light emitted from optical elements and to prevent the adhesive agent from being denatured. This makes it possible to enhance the reliability of lens bonding. Furthermore, there is no need to use an expensive resistant adhesive agent. An existing typical adhesive agent may be used as it is. This provides an effect of saving costs. Thus, there is an advantage in that a low-priced existing bonding material may be applied to a high-priced UV-C (deep-UV) package.

DETAILED DESCRIPTION OF THE PREFERRED EMBODIMENTS

The following disclosure merely illustrates the principle of the invention. While not explicitly described or illustrated in the subject specification, it may be possible to invent different devices which realize the principle of the invention and which fall within the conception and scope of the invention. Furthermore, all the conditional terms and embodiments disclosed herein are essentially intended to facilitate understanding of the concept of the invention. It is to be understood that the embodiments and states specifically described herein are not limitative.

The above objects, features and advantages will become more apparent from the following detailed descriptions given in conjunction with the accompanying drawings. Thus, a person having an ordinary knowledge in the technical field to which the invention pertains will be able to easily carry out the technical concept of the invention.

In describing the invention, if it is determined that the detailed descriptions on the prior art related to the invention may unnecessarily make obscure the spirit of the invention, the descriptions will be omitted. Hereinafter, a preferred embodiment of a chip substrate including a groove portion according to the present invention will be described in detail with reference to the accompanying drawings. For the sake of convenience, descriptions will be made by taking a UV LED as an example of a chip.

Figure 1:
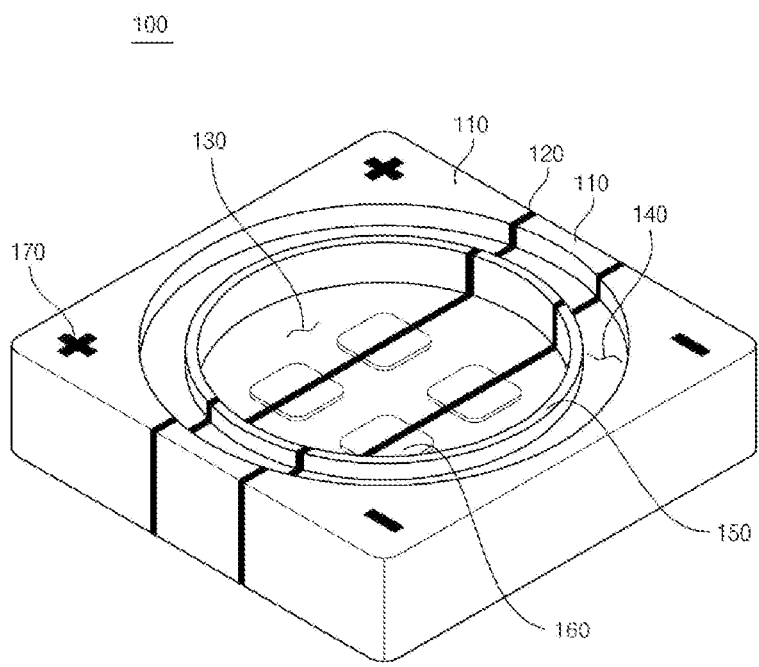
FIG. 1 is a perspective view illustrating a chip substrate including a groove portion according to one embodiment of the present invention.

FIG. 1 is a perspective view illustrating a chip substrate 100 including a groove portion 140 according to one embodiment of the present invention.

Referring to FIG. 1, the chip substrate 100 including the groove portion 140 according to the present embodiment includes conductive portions 110, insulation portions 120, a cavity 130, a groove portion 140, an outer wall 150, bumps 160, and electrode indication portions 170.

In the present embodiment, voltages are applied to chips 300 mounted to the conductive portions 110. That is to say, the conductive portions 110 are made of an electrically conductive material in order to apply voltages to the chips 300. The lower portions of the conductive portions 110 are bonded to a printed circuit board or the like in which electrodes are formed. Thus, the conductive portions 110 are applied with voltages from the outside. In the present embodiment, the conductive portions 110 may be formed by an aluminum plate.

The insulation portions 120 electrically isolate the conductive portions 110 in order to apply voltages to the respective electrode portions of the chips 300. That is to say, the insulation portions 120 electrically isolate the conductive portions 110 in order to apply voltages, i.e., a positive voltage and a negative voltage, to the chips 300. The respective conductive portions 110 thus isolated are applied with a positive voltage and a negative voltage from the outside.

Furthermore, in the present embodiment, the conductive portions 110 may be formed in a plural number in order to apply voltages to at least two or more chips. That is to say, referring to FIG. 1, three conductive portions 110 may be bonded in one unit substrate 100.

Moreover, in the present embodiment, the insulation portions 120 are formed in a plural number in order to isolate the conductive portions 110 to apply different voltages to at least two or more chips. That is to say, referring to FIG. 1, in one unit substrate 100, two insulation portions 120 may be formed between three conductive portions 110.

In the present embodiment, the insulation portions 120 may be formed of insulation films made of a synthetic resin. In this case, the conductive portions 110 and the insulation portions 120 are bonded using a liquid adhesive agent or the like. In order to increase the bonding force, the bonding may be performed by interposing synthetic-resin-made bonding films between the conductive portions 110. In order to further increase the bonding force, the bonding process may be performed within a high-temperature/high-pressure chamber capable of maintaining a temperature higher than a room temperature and a pressure higher than an atmospheric pressure. In addition, the boding process may be performed after the bonding surfaces are roughened by a mechanical or chemical method.

That is to say, in the present embodiment, at least one surface of the conductive portions 110, preferably the surface of each of the conductive portions 110 facing each of the insulation portions 120, may be subjected to anodizing. Then, each of the insulation portions 120 may be bonded to the anodized surface of each of the conductive portions 110. In other words, if the conductive portions 110 are made of aluminum, the respective bonding surfaces may be anodized prior to the bonding process in order to increase the bonding force. The anodized surfaces may be roughened as mentioned above.

In the present embodiment, if the conductive portions 110 are made of aluminum, each of the insulation portions 120 may be bonded by anodizing the surface of each of the conductive portions 110 facing the insulation portions 120.

In the present embodiment, a cavity 130 depressed inward of the conductive portions 110 is formed in the chip substrate 100 including the groove portion 140 in order to form a space in which the chips 300 are mounted. That is to say, referring to FIGS. 1 and 2, the surface of the chip substrate 100 on which the chips 300 are mounted is formed in a shape depressed from the external surface. In other words, the substrate has such a shape that the outer wall 140 is formed around a region where the chips 300 are mounted.

That is to say, in the present embodiment, the chips are mounted on the conductive portions 110 in the space defined within the cavity 130. After the chips are mounted, the cavity 130 is sealed by a lens or the like, thereby manufacturing a chip package.

In the present embodiment, the chip substrate 100 may further include the groove portion 140.

Referring to FIG. 1, the groove portion 140 according to the present embodiment is formed outside the cavity 130 in a spaced-apart relationship with the cavity 130 and is formed at a predetermined depth in a recessed shape.

The expression "outside the cavity 130" means that the groove portion 140 is formed more outward than the cavity 130 on the chip substrate 100. The expression "spaced-apart relationship" means that the groove portion 140 is formed without overlapping with the cavity 130 so as to leave a gap between the groove portion 140 and the cavity 130 as illustrated in FIG. 1.

Figure 2:
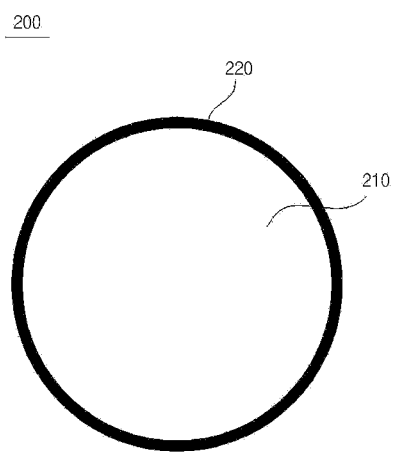
FIG. 2 is a view illustrating a sealing member of the chip substrate including the groove portion according to one embodiment of the present invention.

In the gap thus formed, there is formed the outer wall 150 which isolates the cavity 130 and the formation space of the groove portion 140 as illustrated in FIG. 2. The outer wall 150 prevents the ultraviolet rays emitted from UV LEDs from entering the groove portion 140.

In the present embodiment, the groove portion 140 may preferably be formed to continuously extend along the cavity 130. That is to say, the groove portion 140 is continuously formed in order to increase the contact area with a sealing member 200 which performs sealing during the manufacture of a chip package. This makes it possible to increase the bonding force between the sealing member 200 and the chip substrate 100. Since the groove portion 140 is continuously formed, an adhesive agent 400 can be poured into the groove portion 140 through a single pouring process. This provides an advantage in terms of processes.

Alternatively, in view of the process for forming the groove portion 140, it goes without say that, for example, two groove portions are divisionally formed.

Figure 4:
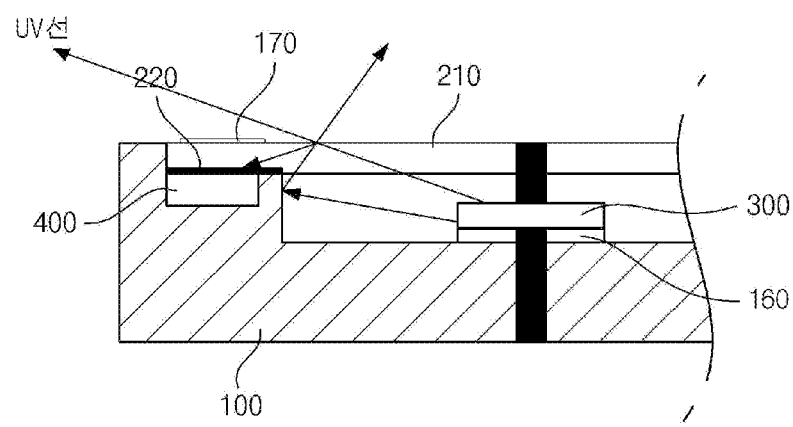
FIG. 4 is a view illustrating a shielding example of the chip package which makes use of the chip substrate including the groove portion according to one embodiment of the present invention.

As illustrated in FIG. 4, by forming the groove portion 140 according to the present embodiment, it is possible to prevent the adhesive agent 400 from being exposed to the ultraviolet rays primarily emitted from the chips 300. This makes it possible to prevent the adhesive agent 400 from being denatured and to enhance the reliability of the lens bonding.

In the present embodiment, the chip substrate 100 may further include bumps 160. In the present embodiment, the bumps 160 are formed at a predetermined height within the cavity 140 on the surfaces of the respective conductive portions isolated by the insulation portions. The bumps 160 are bonded to the electrode portions formed in the chips.

In the present embodiment, the bumps 160 are formed at a predetermined height on the surfaces of the respective conductive portions 110 isolated by the insulation portions 120 and are bonded to the electrode portions formed in the chips 300. That is to say, the bumps 160 are formed on the surfaces of the conductive portions 110. Referring to FIG. 2, the bumps 160 are formed on the surfaces of the conductive portions 110 across the insulation portions 120.

That is to say, the bumps 160 are formed at a predetermined height on the surfaces of the conductive portions 110 isolated by the insulation portions 120. The bumps 160 are preferably made of a conductive material so that the voltages applied to the conductive portions 110 can be applied to the electrode portions of the chips 300 mounted on the bumps 160. The bumps 160 may be gold bumps made of gold.

In the present embodiment, if the optical elements mounted as the chips 300 has a flip chip structure in which the electrode portions are positioned at the lower ends of the optical elements, the electrode portions are formed on one surface of the chips 300 facing the surfaces of the conductive portions 110 in which the cavity 130 is formed. The bumps 160 are bonded to the electrode portions formed on one surfaces of the chips 300 facing the bumps 160 and may be applied with voltages.

Figure 3:
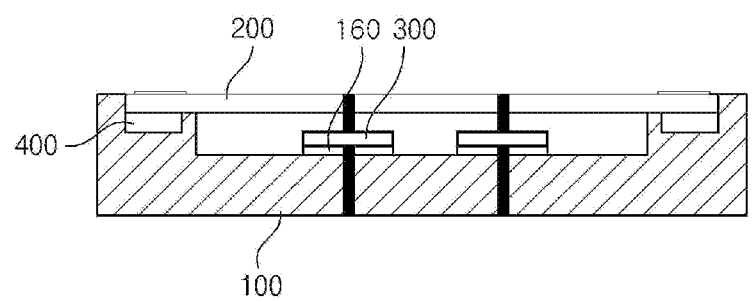
FIG. 3 is a view illustrating a sealing member of a chip package which makes use of the chip substrate including the groove portion according to one embodiment of the present invention.

FIG. 3 is a view illustrating a chip package in which the chips 300 are mounted on the chip substrate 100 according to the embodiment described above. In FIG. 3, the electrode portions of the chips 300 are formed on the bottom surfaces of the chips 300. If the chips 300 are mounted on the chip substrate 100, the electrode portions of the chips 300 make contact with the bumps 160 formed in the chip substrate 100.

Accordingly, in the present embodiment, the bumps 160 are formed in the regions (electrode regions) of the aluminum chip substrate 100 in which the chips 300 are to be positioned. In another embodiment, the bumps 160 may be previously formed in the electrode portions of chips. Alternatively, the electrode portions of chips may be formed at such a thickness that the electrode portions can serve as bumps. In this case, the chips may be directly bonded to the aluminum chip substrate 100.

Referring again to FIG. 3, the chip substrate 100 may further include solders (not illustrated) which are formed on the surfaces of the bumps 160 in order to solder the electrode portions and the bumps 160. The plating layers (not illustrated) formed in the electrode regions of UV chips and the bumps 160 may be bonded by a thermo-sonic bonding method. Alternatively, solders (not illustrated) may be formed on the surfaces of the bumps 160 so that the chips and the bumps 160 can be bonded by soldering.

Furthermore, the chip substrate 100 including the groove portion 140 according to the present embodiment may further include electrode indication portions 170.

Referring again to FIG. 1, as described above, in the chip substrate 100 according to the present embodiment, each of the insulation portions 120 is interposed between two conductive portions 110. Thus, voltages of opposite polarities may be applied to the respective conductive portions 110 isolated by the insulation portions 120. Accordingly, if a mark is formed on the surface of one of the conductive portions 110 and if it is promised in advance that, for example, a positive voltage is applied to one of the conductive portions 110 having the mark, a user can easily determine the polarity of each of the conductive portions 110.

Hereinafter, the sealing member 200 of the chip substrate 100 including the groove portion 140 according to the present embodiment will be described with reference to FIG. 2.

The sealing member 200 according to the present embodiment includes a sealing portion 210 and a shielding portion 220.

The sealing portion 210 is disposed on the upper surface of the chip substrate 100 which includes the conductive portions 110 laminated in one direction and the insulation portions 120 alternately laminated with the conductive portions 110 to electrically isolate the conductive portions 110. The sealing portion 210 is configured to seal the cavity 130 formed at a predetermined depth in a recessed shape in the region including the insulation portions 120.

Referring to FIG. 2, the sealing portion 210 is preferably formed of a circular lens. In this regard, the shape of the sealing portion 210 is determined depending on the shape of the cavity 130 and the shape of the groove portion 140 to be sealed. Since the chip substrate 100 illustrated in FIG. 1 includes the circular cavity 130 and the circular groove portion 140, the sealing portion 210 is formed in a circular shape. Accordingly, the shape of the sealing portion 210 may vary with the shape of the cavity 130 and the groove portion 140 of the chip substrate 100.

The shielding portion 220 is formed on one surface of the sealing portion 210 in a corresponding relationship with the groove portion 140 which is disposed outside the cavity 130 in a spaced-apart relationship with the cavity 130 and which is formed at a predetermined depth in a recessed shape.

Referring to FIG. 2, the shielding portion 220 may be formed at a predetermined thickness in a ring shape along the circular contour line of the sealing portion 210.

In this regard, the thickness of the shielding portion 220 may be determined in view of the thickness of the groove portion 140 and the spaced-apart distance between the cavity 130 and the groove portion 140.

More specifically, if the thickness of the shielding portion 220 is smaller than the thickness of the groove portion 140, it is impossible to prevent the entry into the groove portion 140 of the light reflected by the lens surface as illustrated in FIG. 4. Preferably, as illustrated in FIG. 3, the shielding portion 220 is formed in the region including both the groove portion 140 and the outer wall 150. In this case, it is possible to secondarily prevent the entry of light into the groove portion 140 in a reliable manner.

A chip package including the groove portion 140 according to one embodiment of the present invention will now be described with reference to FIG. 3.

The chip package according to the present embodiment includes a chip substrate 100, optical elements 300 and a sealing member 200.

In the present embodiment, the chip substrate 100 includes conductive portions 110 laminated in one direction to constitute the chip substrate 100, insulation portions 120 alternately laminated with the conductive portions 110 to electrically isolate the conductive portions 110, a cavity 130 formed at a predetermined depth in a recessed shape in a region including the insulation portions 120, and a groove portion 140 disposed outside the cavity 130 in a spaced-apart relationship with the cavity 130 and formed at a predetermined depth in a recessed shape.

The optical elements 300 are mounted within the cavity 130.

The sealing member 200 is bonded to the chip substrate 100 by an adhesive agent 400 disposed within the groove portion 140 in order to seal the cavity 130. The sealing member 200 includes a shielding portion 220 formed on one surface corresponding to the groove portion 140.

The chip substrate 100, the optical elements and the sealing member 200 have the configurations corresponding to those described in the aforementioned embodiment. Thus, duplicate descriptions thereon will be omitted.

According to the present invention described above, the adhesive agent 400 is applied in the groove portion formed in advance as illustrated in FIG. 4. It is therefore possible to prevent the adhesive agent 400 from being exposed to the light emitted from optical elements and to prevent the adhesive agent 400 from being denatured. This makes it possible to enhance the reliability of sealing member (lens) bonding. Furthermore, there is no need to use an expensive resistant adhesive agent 400. An existing typical adhesive agent may be used as it is. This provides an effect of saving costs. Thus, there is an advantage in that a low-priced existing bonding material may be applied to a high-priced UV-C (deep-UV) package.

The forgoing descriptions are mere illustration of the technical concept of the present invention. A person having an ordinary knowledge in the technical field to which the invention pertains will be able to make modifications, changes and substitutions without departing from the essential features of the invention.

Accordingly, the embodiments and the accompanying drawings disclosed herein are not intended to limit the technical concept of the present invention but are intended to describe the present invention. The technical concept of the present invention shall not be limited by the embodiments and the accompanying drawings. The protection scope of the present invention shall be construed on the basis of the appended claims. All the technical concepts which are equivalent in scope to the claims shall be construed to fall within the scope of the present invention.

What is claimed is:

1. A chip package, comprising:
a chip substrate which includes conductive portions laminated in one direction to constitute the chip substrate, insulation portions alternately laminated with the conductive portions to electrically isolate the conductive portions, a cavity depressed inward of the conductive portions in a region including the insulation portions, and a groove portion disposed outside the cavity in a spaced-apart relationship with the cavity and formed at a predetermined depth in a recessed shape;
an optical element mounted within the cavity; and
a sealing member bonded to the chip substrate by an adhesive agent disposed within the groove portion in order to seal the cavity, the sealing member including a shielding portion formed on one surface corresponding to the groove portion,
wherein the groove portion is formed on partial regions of the conductive portions and partial regions of the insulation portions, and the adhesive agent is disposed on the partial regions of the conductive portions and the partial regions of the insulation portions.

2. The chip package of claim 1, wherein the groove portion is formed to continuously extend along an outer periphery of the cavity.

3. The chip package of claim 1, further comprising:
an outer wall formed between the cavity and the groove portion to isolate the groove portion from the cavity.

4. The chip package of claim 3, wherein a height of the outer wall is determined by a thickness of the sealing member.

5. The chip package of claim 1, wherein the conductive portions or the insulation portions are formed in a plural number and the cavity is formed in a recessed shape in a region including at least two or more of the conductive portions and at least one or more of the insulation portions.

6. The chip package of claim 1, wherein each of the insulation portions is bonded to each of the conductive portions through an anodizing layer formed on at least one surface of each of the conductive portions and is configured to electrically isolate the conductive portions.

7. The chip package of claim 1, further comprising:
bumps formed at a predetermined height within the cavity on surfaces of the conductive portions isolated by the insulation portions, the bumps bonded to electrode portions formed in chips mounted on the chip substrate.

8. The chip package of claim 1, wherein the sealing member further includes:
a sealing portion configured to seal the cavity.

9. The chip package of claim 8, wherein a thickness of the shielding portion is determined in view of a thickness of the groove portion and a spaced-apart distance between the cavity and the groove portion.

10. The chip package of claim 8, wherein the shielding portion is formed on one surface of the sealing portion at a thickness including the groove portion in order to prevent entry into the groove portion of light reflected by one surface of the sealing portion.

11. The chip package of claim 8, wherein the shielding portion is made of a material for shielding light reflected by one surface of the sealing portion in order to prevent entry into the groove portion of the light.

12. The chip package of claim 8, wherein the shielding portion is formed on a surface of the sealing portion which is bonded to the chip substrate.

* * * * *